(12) United States Patent
DeMent et al.

(10) Patent No.: US 7,739,573 B2
(45) Date of Patent: Jun. 15, 2010

(54) VOLTAGE IDENTIFIER SORTING

(75) Inventors: Jonathan J. DeMent, Austin, TX (US); Sang H. Dhong, Austin, TX (US); Gilles Gervais, Austin, TX (US); Alain Loiseau, Williston, VT (US); Kirk D. Peterson, Jericho, VT (US); John L. Sinchak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 732 days.

(21) Appl. No.: 11/621,766

(22) Filed: Jan. 10, 2007

(65) Prior Publication Data

US 2008/0168318 A1    Jul. 10, 2008

(51) Int. Cl.
 *G01R 31/30* (2006.01)
(52) U.S. Cl. .................. 714/745; 714/712; 714/724; 714/742; 438/14; 438/17; 324/765; 324/713; 702/60
(58) Field of Classification Search .................. None
See application file for complete search history.

(56) References Cited

U.S. PATENT DOCUMENTS 7,058,531 B2   6/2006   Appleyard et al.
2002/0084798 A1*   7/2002   Osburn et al. ............... 324/765
2002/0130712 A1   9/2002   Naffziger et al.
2004/0224430 A1*   11/2004   Arabi et al. ................... 438/14
2008/0082873 A1*   4/2008   Russell et al. ................ 714/721
2008/0091990 A1*   4/2008   Bruce et al. .................. 714/721

OTHER PUBLICATIONS

U.S. Appl. No. 11/758,034, filed Jun. 5, 2007, Bradley et al.

* cited by examiner

*Primary Examiner*—John P Trimmings
(74) *Attorney, Agent, or Firm*—Stephen R. Tkacs; Stephen J. Walder, Jr.; Matthew B. Talpis (57) ABSTRACT

A voltage identifier (VID) sorting system is provided that optimizes processor power and operating voltage guardband at a constant processor frequency. The VID sorting system determines a voltage versus current curve for the processor. The VID sorting system then uses the voltage versus current characteristics to calculate the power for each VID to determine an acceptable range of VIDs within the maximum power criteria. The VID sorting system then tests VIDs in the range and selects a VID from the range to optimize for minimum power and/or maximum voltage guardband at a constant processor frequency.

20 Claims, 6 Drawing Sheets

VOLTAGE IDENTIFIER SORTING

BACKGROUND

1. Technical Field

The present application relates generally to an improved data processing system and method. More specifically, the present application is directed to a voltage identifier sorting system and method.

2. Description of Related Art

In the early days of computing, engineers and designers were not concerned about how much power a processor used. Early processors had a single voltage level that was used by the motherboard and processor, typically 5 volts.

The amount of power used is a function of the amount of voltage. Power consumption equates largely with heat generation, which is a primary enemy in achieving increased performance. With a growing number of computers in use, energy conservation has become an issue in computer design. Thus, as processors have increased in speed and size, designers have become more and more concerned about the amount of power being consumed. The first step to solve this concern was to reduce the voltage level to 3.3 volts.

Newer processors reduce voltage levels even more by using what is called a "dual voltage" or "split rail" design. A split rail uses two different voltages. The external or I/O voltage is higher, typically 3.3 volts, for compatibility with the other chips on the motherboard. The internal or "core voltage" is lower, usually 1.0 to 2.9 volts.

Multiple core processors complicate the issue of power consumption even further. The term "core" typically refers to a relatively large, general-purpose logic function that is used as a building block in a chip design. In a microprocessor, a core may be a central processing unit (CPU) or "processor." A multiple core processor has a plurality of processor cores on a single piece of silicon. Within the context of this disclosure, a multiple core processor may also be referred to as a "system on a chip." In microprocessor design, processor manufacturers try to solve the concern about power consumption by using lower-power semiconductor processes and shrinking the die size, while still adding more and more functionality to the chip. As the die size shrinks and more components, such as processor cores, are packed into the processor design, variability in fabrication has a greater impact on performance and power consumption.

SUMMARY

The illustrative embodiments recognize the disadvantages of the prior art and provide a voltage identifier (VID) sorting system that optimizes processor power and operating voltage guardband at a constant processor frequency. The VID sorting system determines a voltage versus current curve for the processor. The VID sorting system then uses the voltage versus current characteristics to calculate the power for each VID to determine an acceptable range of VIDs within the maximum power criteria. The VID sorting system then tests VIDs in the range and selects a VID from the range to optimize for minimum power and/or maximum voltage guardband at a constant processor frequency.

In one illustrative embodiment, a method is provided for sorting voltage identifiers for a processor. The method comprises determining, using a semiconductor testing system, an acceptable range of voltage identifiers and identifying, using the semiconductor testing system, a lowest voltage identifier from the acceptable range of voltage identifiers that passes a functionality test. The method further comprises identifying, using the semiconductor testing system, a highest voltage identifier from the acceptable range of voltage identifiers that passes a maximum thermal design point power test and a maximum current test. If both a lowest voltage identifier and a highest voltage identifier are found, the method selects a voltage identifier between the lowest voltage identifier and the highest voltage identifier.

In one exemplary embodiment, determining an acceptable range of voltage identifiers comprises determining an initial voltage based on ring oscillator speeds and measuring a first current at the initial voltage. The initial voltage and the first current form a first point. Determining an acceptable range of voltage identifiers further comprises calculating a maximum power voltage at the maximum acceptable power based on the first current and measuring a second current at the maximum power voltage plus a guardband value. The maximum power voltage and the second current form a second point. The method further comprises determining a current versus voltage equation based on the first point and the second point.

In another exemplary embodiment, identifying a lowest voltage identifier that passes a functionality test comprises selecting a minimum voltage identifier as a test voltage identifier, determining whether the test voltage identifier passes the functionality test and if the test voltage identifier passes the functionality test, selecting the test voltage identifier as the lowest voltage identifier.

In a further exemplary embodiment, determining whether the test voltage identifier passes the functionality test comprises determining a current versus voltage curve for the processor, determining a voltage regulator module loadline for the test voltage identifier, determining a test voltage at which the voltage regulator module loadline crosses the current versus voltage curve for the processor, subtracting a guardband value from the test voltage to provide a minimum functional test voltage, and testing functionality of the processor at the minimum functional test voltage.

In a still further exemplary embodiment, identifying a lowest voltage identifier that passes a functionality test further comprises if the test voltage identifier does not pass the functionality test, selecting a next higher voltage identifier as the test voltage identifier, and determining whether the test voltage identifier passes the functionality test.

In another exemplary embodiment, identifying a highest voltage identifier from the acceptable range of voltage identifiers that passes a maximum thermal design point power test and a maximum current test comprises selecting a maximum voltage identifier as a test voltage identifier determining whether the test voltage identifier passes the maximum thermal design point power test, and if the test voltage identifier does not pass the maximum thermal design point power test, selecting a next lower voltage identifier as the test voltage identifier. Identifying a highest voltage identifier from the acceptable range of voltage identifiers further comprises repeating the maximum thermal design point power test until a test voltage identifier passes the maximum thermal design point power test.

In yet another exemplary embodiment, identifying a highest voltage identifier from the acceptable range of voltage identifiers that passes a maximum thermal design point power test and a maximum current test further comprises responsive to a test voltage identifier passing the maximum thermal design point power test, determining whether the test voltage identifier passes the maximum current test, and if the test voltage identifier passes the maximum current test, selecting the test voltage identifier as the highest voltage identifier.

In a further exemplary embodiment, identifying a highest voltage identifier from the acceptable range of voltage identifiers that passes a maximum thermal design point power test and a maximum current test comprises if the test voltage identifier does not pass the maximum current test, selecting a next lower voltage identifier as the test voltage identifier, and repeating the maximum current test until a test voltage identifier passes the maximum current test.

In a still further embodiment, the method further comprises fusing the selected voltage identifier in voltage identifier logic in the processor.

In another illustrative embodiment, a data processing system for sorting voltage identifiers for a processor is provided. The data processing system comprises a processor and a memory coupled to the processor. The memory contains instructions which, when executed by the processor, cause the processor to determine an acceptable range of voltage identifiers, identify a lowest voltage identifier from the acceptable range of voltage identifiers that passes a functionality test, identify a highest voltage identifier from the acceptable range of voltage identifiers that passes a maximum thermal design point power test and a maximum current test, and if both a lowest voltage identifier and a highest voltage identifier are found, select a voltage identifier between the lowest voltage identifier and the highest voltage identifier.

In other exemplary embodiments, the data processing system performs various ones of the operations outlined above with regard to the method in the illustrative embodiments.

In a further illustrative embodiment, a computer program product comprising a computer useable medium having a computer readable program is provided. The computer readable program, when executed on a computing device, causes the computing device to determine an acceptable range of voltage identifiers, identify a lowest voltage identifier from the acceptable range of voltage identifiers that passes a functionality test, identify a highest voltage identifier from the acceptable range of voltage identifiers that passes a maximum thermal design point power test and a maximum current test, and if both a lowest voltage identifier and a highest voltage identifier are found, select a voltage identifier between the lowest voltage identifier and the highest voltage identifier.

In other exemplary embodiments, the computer readable program may cause the computing device to perform various ones of the operations outlined above with regard to the method in the illustrative embodiments.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

Figure 1A:
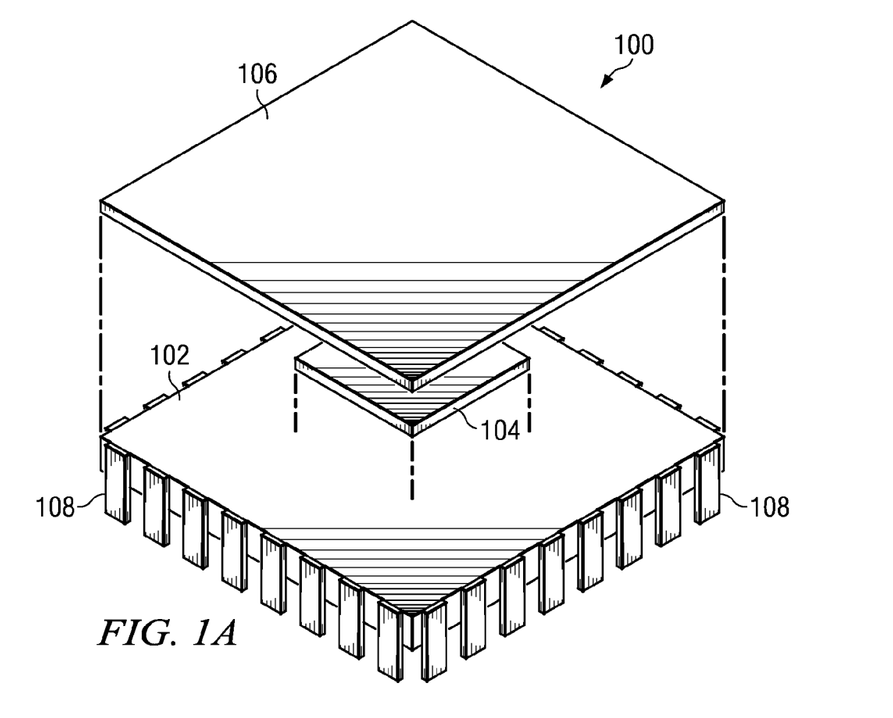
FIGS. 1A and 1B illustrate an example chip package assembly for which aspects of the exemplary embodiments may be implemented.
Figure 1B:
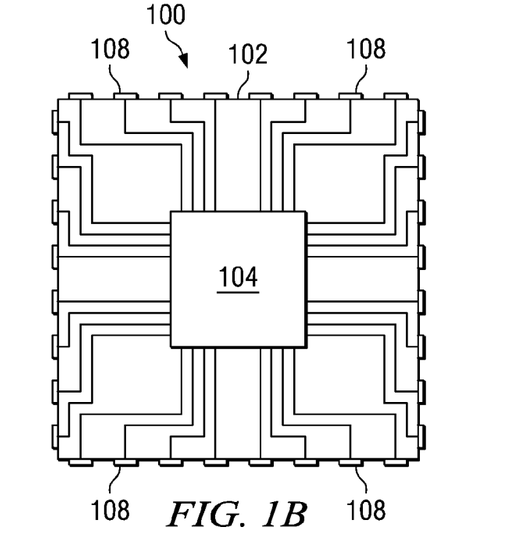

With reference now to the drawings, FIGS. 1A and 1B illustrate an example chip package assembly for which aspects of the exemplary embodiments may be implemented. More particularly, with reference to FIG. 1A, package assembly 100 includes die 104, which is placed on package 102. A die is an unpackaged piece of silicon containing the functional components of a device. "Die" is the formal term for the square of silicon containing an integrated circuit. A package is a housing that chips, or "dice" (plural of die), come in for plugging into or soldering onto printed circuit boards. Package 102 provides electrical wiring and connections to pins 108. Lid 106 covers die 104 and bonds with package 102.

Die 104 is bonded to package 102 using, for example, solder, controlled collapse chip connection (C4), or wire bond. A person of ordinary skill in the art will recognize that other package configurations may also be used, such as flip-chip, for example.

Although "chip" is sometimes used to refer to an entire package assembly, the word "chip" is often used as a synonym for "die." Creating a mounting for a chip might seem trivial to the uninitiated, but the ability to provide more and more input/output (I/O) interconnections to chips that are shrinking in size and growing in complexity is an ever-present problem.

A common chip package assembly is the dual in-line package (DIP). A DIP is a rectangular chip housing with leads (pins) on both long sides. Tiny wires bond the chip to metal leads that wind their way into spider-like feet that are inserted into a socket or soldered onto a circuit board. A ceramic dual in-line package (CDIP) is a type of ceramic DIP chip made of ceramic materials. A CDIP package is made of ceramic materials and uses gold-plated leads attached to two sides by brazing and a metal lid bonded to the chip with a metal seal. A CERDIP uses a ceramic lid that is bonded to the chip with a glass seal. A plastic leaded chip carrier (PLCC) package is a plastic, square, surface mount chip package that contains leads on all four sides. The leads (pins) extend down and back under and into tiny indentations in the housing. A ceramic quad (CERQUAD) package is a square, ceramic, surface mount chip package. A CERQUAD package uses a ceramic lid that is bonded to the chip with a glass seal. A CERQUAD package has pins on all four sides that wrap under like those of a PLCC package. Other package types are known to those skilled in the art, and aspects of the illustrative embodiments may be applied to any package type.

FIG. 1B illustrates a top-down, cross sectional view of package 100. Die 104 is surface mounted onto package 102. As seen in FIG. 1B, package 102 provides tiny wires to connect the components on die 104 with pins 108. Pins 108 provide connection to off-chip components. For example, if chip 104 is a processor, pins 108 may provide connection to system memory or a system bus, for example.

One component that may be connected to die 104 through one or more of pins 108 is a voltage regulator. A voltage regulator is a device or circuit that regulates the voltage fed to, typically, a microprocessor. The power supply of most personal computers generates power at 5 volts. However, most microprocessors require a voltage below 3.5 volts. The job of the voltage regulator is to reduce the 5 volt signal to the lower voltage required by the microprocessor.

Figure 2:
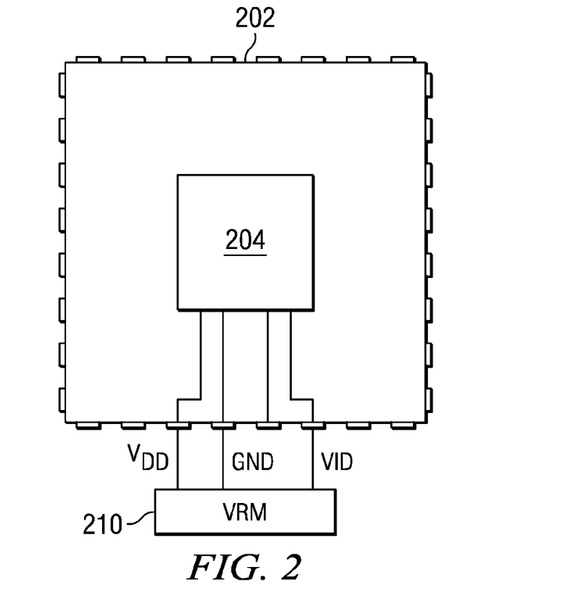
FIG. 2 illustrates a voltage regulator module connected to a chip through a package for which aspects of the illustrative embodiments may be applied.

FIG. 2 illustrates a voltage regulator module connected to a chip through a package for which aspects of the illustrative embodiments may be applied. In the depicted example, die 204 may be, for instance, a microprocessor. Voltage regulator module (VRM) 210 is connected to die 204 through the pins of package 202. Voltage regulator module 210 may provide a supply voltage ($V_{DD}$) and a ground signal (GND).

A voltage regulator module is an electronic device that provides a microprocessor the appropriate supply voltage. A voltage regulator module can be soldered to the motherboard, to which package 202 may also be soldered or connected using a socket mount, or the voltage regulator module may be an installable device. A voltage regulator module allows processors with different supply voltages to be mounted on the same motherboard.

Some voltage regulator modules provide a fixed supply voltage to the processor; however, most voltage regulator modules sense the required supply voltage from the processor. In the depicted example, microprocessor 204 communicates the correct supply voltage to voltage regulator module 210 via a number of bits called the voltage identifier (VID). In particular, voltage regulator module 210 may initially provide a standard supply voltage to VID logic (not shown) within microprocessor 204. One purpose of the VID logic is to send the VID to voltage regulator module 210. When voltage regulator module 210 receives the VID identifying the required supply voltage, it begins operating as a voltage regulator, providing the required constant voltage supply ($V_{DD}$) to the processor.

The processor configuration in FIG. 2 may be a single-core microprocessor design. That is, the microprocessor in FIG. 2 may have only one central processor unit (CPU), also referred to as a "processor" or "core." A single-core processor requires only one supply voltage, or perhaps two for a split-rail design where the processor is fed two voltages: the external or "I/O" voltage and the internal or "core" voltage. However, multiple core microprocessors may complicate the issue of power consumption. Processor manufacturers try to solve the concern about power consumption by using lower-power semiconductor processes and shrinking the die size, while still adding more and more functionality to the chip. As the die size shrinks and more components are packed into the processor design, variability in fabrication has a greater impact on performance and power consumption.

Figure 3:
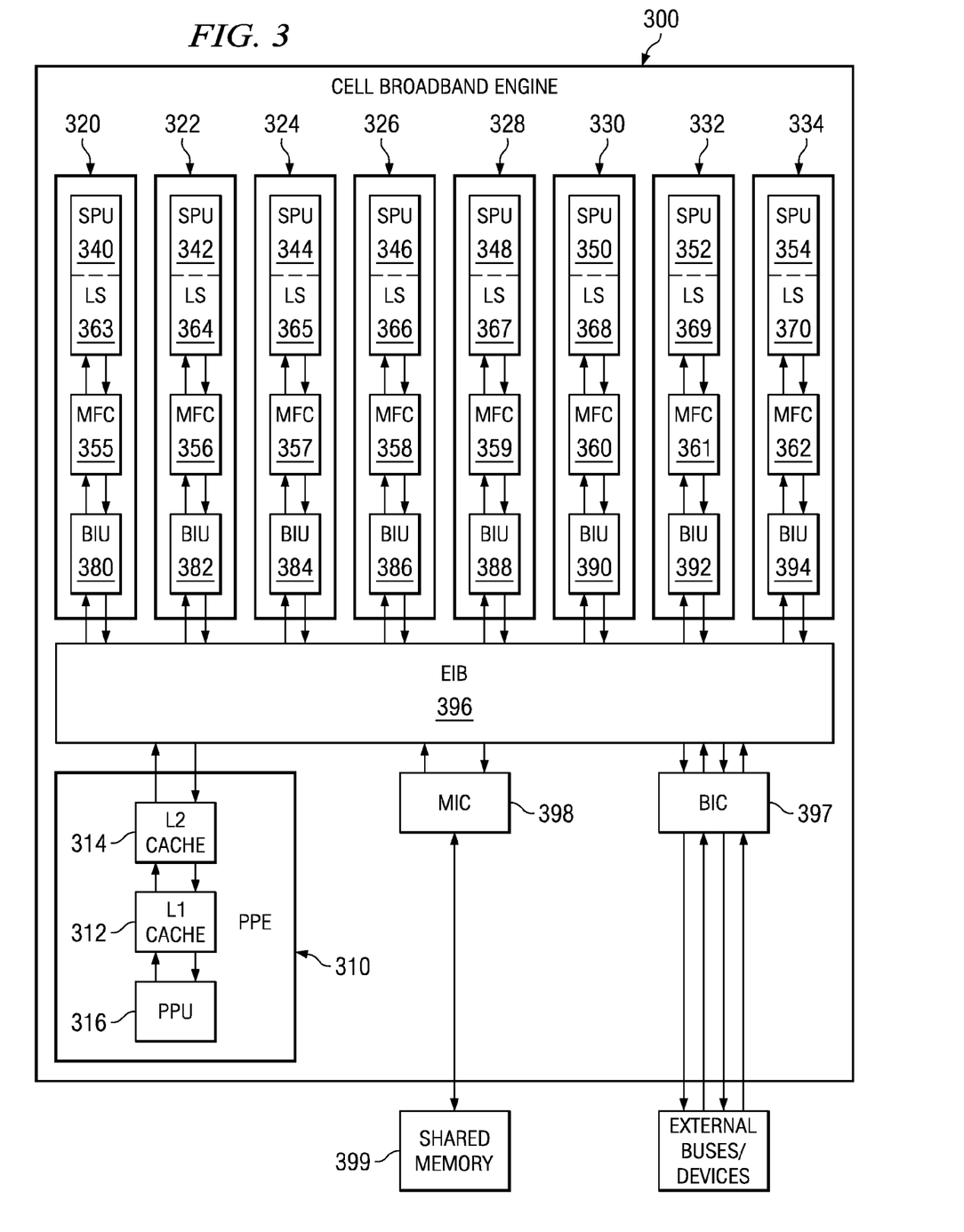
FIG. 3 is an exemplary block diagram of a data processing system for which aspects of the present invention may be implemented.

FIG. 3 is an exemplary block diagram of a data processing system for which aspects of the present invention may be implemented. The exemplary data processing system shown in FIG. 3 is an example of the Cell Broadband Engine (CBE) data processing system, wherein CBE processor 300 is a heterogeneous, multiple core data processor. CBE 300 will be used as an example of a multiple core data processor in the description of the illustrative embodiments of the present invention; however, the present invention is not limited to such, as will be readily apparent to those of ordinary skill in the art upon reading the following description.

As shown in FIG. 3, CBE processor 300 includes a power processor element (PPE) core 310 having a power processor unit (PPU) 316 and its L1 and L2 caches 312 and 314, and multiple synergistic processor element (SPE) cores 320-334 that each has its own synergistic processor unit (SPU) 340-354, memory flow control 355-362, local memory or store (LS) 363-370, and bus interface unit (BIU) 380-394, which may be, for example, a combination direct memory access (DMA), memory management unit (MMU), and bus interface unit. A high-bandwidth, internal element interconnect bus (EIB) 396, a bus interface controller (BIC) 397, and a memory interface controller (MIC) 398 are also provided. Accordingly, CBE processor 300 has a total of nine cores: one PPE core and eight SPE cores.

CBE processor 300 may be a system-on-a-chip such that each of the elements depicted in CBE processor 300 may be provided on a single microprocessor chip. Shared memory 399, as well as external busses and devices, are provided off chip. Moreover, CBE processor 300 is a heterogeneous processing environment in which each of the SPU cores may receive different instructions from each of the other SPU cores in the system. Moreover, the instruction set for the SPU cores is different from that of the PPU core, e.g., the PPU core may execute PowerPC™ Reduced Instruction Set Computer (RISC) based instructions while the SPU cores may execute vectorized instructions.

SPE cores 320-334 are coupled to each other and to the L2 cache 314 via the EIB 396. In addition, the SPE cores 320-334 are coupled to MIC 398 and BIC 397 via the EIB 396. The MIC 398 provides a communication interface to shared memory 399. The BIC 397 provides a communication interface between the CBE 300 and other external buses and devices.

PPE core 310 may be dual threaded. The combination of this dual threaded PPE 310 and the eight SPEs 320-334 makes CBE processor 300 capable of handling 10 simultaneous threads and over 128 outstanding memory requests. PPE core 310 acts as a controller for the other eight SPE cores 320-334, which handle most of the computational workload. PPE core 310 may be used to run conventional operating systems while SPE cores 320-334 perform vectorized floating point code execution, for example.

SPE cores 320-334 comprise a synergistic processing unit (SPU) 340-354, memory flow control units 355-362, local memory or store 363-370, and an interface unit 380-394. The local memory or store 363-370, in one exemplary embodiment, comprises a 256 KB instruction and data memory which is visible to PPE core 310 and can be addressed directly by software.

PPE core 310 may load SPE cores 320-334 with small programs or threads, chaining the SPE cores together to handle each step in a complex operation. For example, a set-top box incorporating CBE processor 300 may load programs for reading a DVD, video and audio decoding, and display, and the data may be passed off from SPE core to SPE core until it finally ends up on the output display. At 4 GHz, each SPE core 320-334 gives a theoretical 32 GFLOPS of performance with PPE core 310 having a similar level of performance.

The memory flow control units (MFCs) 355-362 serve as an interface for an SPC to the rest of the system and other elements. The MFCs 355-362 provide the primary mechanism for data transfer, protection, and synchronization between main storage and the local storages 363-370. There is logically an EFC for each SPU in a processor. Some implementations can share resources of a single MFC between multiple SPU cores. In such a case, all the facilities and commands defined for the MFC must appear independent to software for each SPU core. The effects of sharing an MFC are limited to implementation-dependent facilities and commands.

Multiple core microprocessors, such as CBE processor 300 shown in FIG. 3, may require separate voltages for each processor core in order to optimize performance. As mentioned above, the term "core" typically refers to a relatively large, general-purpose logic function that is used as a building block in a chip design. In this instance, a core may be a central processing unit (CPU), or "processor," such as PPE core 310 or SPE cores 320-334. As the number of cores grows, the cores of a multiple core microprocessor become more sensitive to variances in fabrication. Thus, the processor, or each individual core, requires a particular voltage to achieve optimal performance and power efficiency.

Voltage identifiers (VIDs) are discrete voltage values that are selected on a by-part basis during manufacturing test to satisfy a single power and performance operating point for the part, such as a processor or an individual processor core, for instance. The VID is fused into VID logic on the part, and the voltage regulator module (VRM) reads the VID when booting up the system in order to program the system VRM setting.

Figures 4, 5:
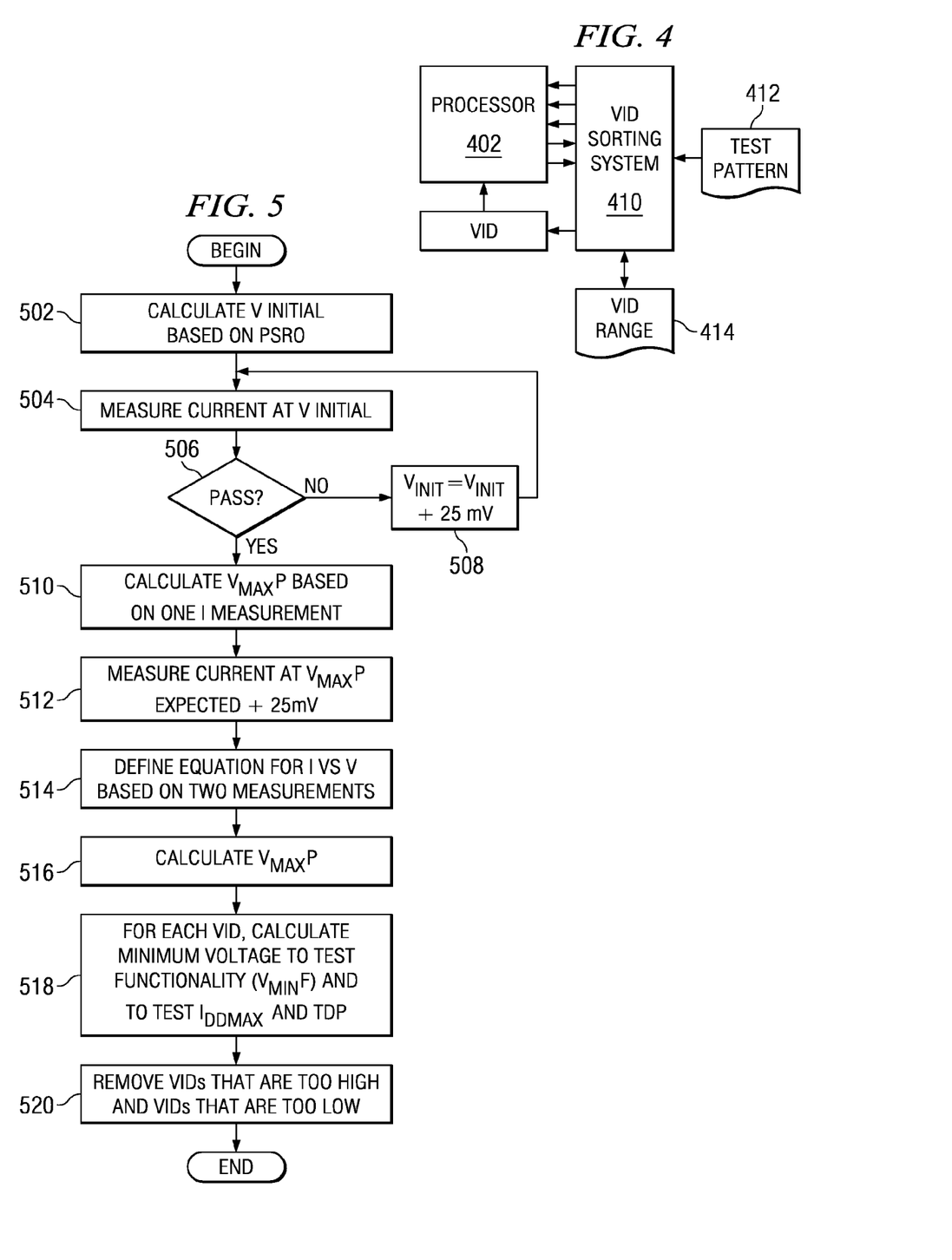
FIG. 4 is a block diagram of a VID sorting system in accordance with an illustrative embodiment.
FIG. 5 is a flowchart illustrating operation of a VID sorting system in defining a voltage/current relationship of a part to determine a VID range satisfying operating specifications in accordance with an illustrative embodiment.

FIG. 4 is a block diagram of a VID sorting system in accordance with an illustrative embodiment. The VID sorting system determines a VID range to achieve a performance requirement, such as 3.2 GHz, for example, and power requirement, such as 110 W maximum power, for instance. VID sorting system 410, which may be embodied within a semiconductor test system, measures current for a low voltage condition and a high voltage condition for a maximum thermal design point (TDP) power.

Thermal design point (TDP) represents the maximum amount of power the thermal solution in a computer system is required to dissipate. For example, a laptop's CPU cooling solution may be designed for a 20 W TDP, which means that it can dissipate the heat generated by 20 W without exceeding the maximum junction temperature for the part. One may typically set the TDP not to the most power the chip could ever draw, but rather the maximum power that the chip would draw when running real applications. This ensures the system will be able to handle all applications without exceeding its thermal envelope, without requiring a cooling solution to work for the maximum theoretical power. Providing a cooling solution that would work for the maximum theoretical power would cost more and would achieve no real benefit under actual operating conditions.

Using the low voltage condition and the high voltage condition, VID sorting system 410 defines the current and voltage (I/V) characteristics of a part, processor 402 in the depicted example. VID sorting system 410 uses this relationship to calculate the power for each VID to determine the acceptable range of VIDs within the maximum power criteria. This often eliminates the highest VIDs from manufacturing test and reduces the test time required for functionally verifying each VID. From empirical analysis of the VIDs and ring oscillator speeds (PSRO), VID sorting system 410 predicts an operating range for processor 402. This often eliminates the lowest VIDs from manufacturing test and further reduces the test time required for functionally verifying each VID.

Then, VID sorting system 410 checks functionality of processor 402. VID sorting system 410 uses the I/V characteristics of processor 402 to determine the lowest operating voltage of the part. VID sorting system 410 then decreases this voltage to ensure sufficient voltage guardband for measurement and reliability tolerances. To account for alternating current (AC) noise, VID sorting system 410 may further adjust this voltage based on variable voltage offsets (VVOs) seen between different manufacturing tests and system applications.

For each VID, VID sorting system 410 calculates a unique voltage for the various tests in order to account for the VRM load line and the I/V characteristics of the part as well as the tester to system voltage differences. The calculated voltage is the only voltage required to test the part for each VID setting.

VID sorting system 410 tests processor 402 using test pattern 412, which may be a comprehensive, speed-limiting test pattern. Based on this prediction, VID sorting system 410 verifies the minimum and maximum VIDs to establish the actual VID range 414 satisfying the operating specification.

Based on customer requirements, one may then choose a VID from VID range 414 in order to optimize for minimum power and/or maximum voltage guardband at a constant processor frequency. Also, VID range 414 may be useful for understanding performance margin and reliability and for optimizing manufacturing process parameters for increased yield.

VID sorting system 410 may be implemented on an Ultra-Flex™ test platform, as one example. However, VID sorting system 410 may be implemented on any known or future semiconductor testing system. "ULTRA-FLEX" is a trademark of Teradyne, Inc. in the United States, other countries, or both. The VID sorting system may also fuse the selected VID into the VID logic on processor 402.

FIG. 5 is a flowchart illustrating operation of a VID sorting system in defining a voltage/current relationship of a part to determine a VID range satisfying operating specifications in accordance with an illustrative embodiment. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

With reference now to FIG. 5, operation begins and the VID sorting system calculates an initial voltage ($V_{INIT}$) based on ring oscillator speed (PSRO) readings (block 502). The VID sorting system determines the current at the initial voltage (block 504).

Next, the VID sorting system determines whether the part passes the operating specifications at the initial voltage (block 506). If the part does not pass, the VID sorting system sets $V_{INIT}$ to be $V_{INIT}+25$ mV (block 508) and operation returns to block 504 to determine the current at $V_{INIT}$.

If the part passes in block 506, the VID sorting system calculates a voltage at the maximum acceptable power ($V_{MAX}P$) based on the one current (I) measurement just made in block 504 (block 510). The VID sorting system then measures the current at $V_{MAX}P$ expected plus 25 mV (block 512). Next, the VID sorting system defines an equation for I versus V based on two measurements from blocks 504 and 512 (block 514). Then, the VID sorting system calculates $V_{MAX}P$ based on the I vs. V equation (block 516).

For each VID, the VID sorting system calculates a minimum voltage to test functionality ($V_{MIN}F$) and to test $I_{DDMAX}$ and the thermal design point (TDP) (block 518). The VID sorting system removes VIDs that are too high and VIDs that are too low (block 520). Thereafter, operation ends.

Figure 6:
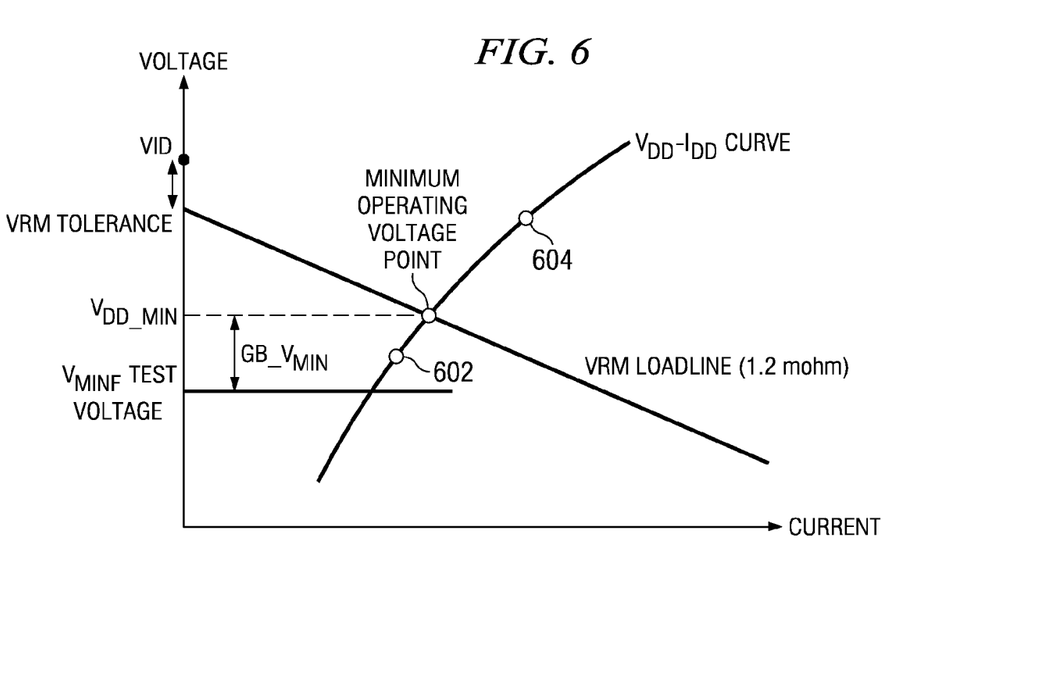
FIG. 6 is a graph illustrating the voltage/current relationship of a part during VID sorting and testing in accordance with an exemplary embodiment.

FIG. 6 is a graph illustrating the voltage/current relationship of a part during VID sorting and testing in accordance with an exemplary embodiment. The VID sorting system may choose a first point 602 and may then measure the current at the first point 602. For a second point 604, the VID sorting system may select a voltage that will give a high power that the VRM can tolerate. The VID sorting system may then measure the current at the second point 604. Given the voltage and current at the first point and the second point, the VID sorting system may then define an equation for the $V_{DD}$-$I_{DD}$ curve.

For every available VID, the VID sorting system may then find the intercept of the VRM load line with the $V_{DD}$-$I_{DD}$ curve. This intercept occurs at a voltage called $V_{DD\_MIN}$. Removing some guardband to $V_{DD\_MIN}$ results in $V_{MINF}$, which is the voltage at which the part must be found functional in order to validate the VID.

Figure 7:
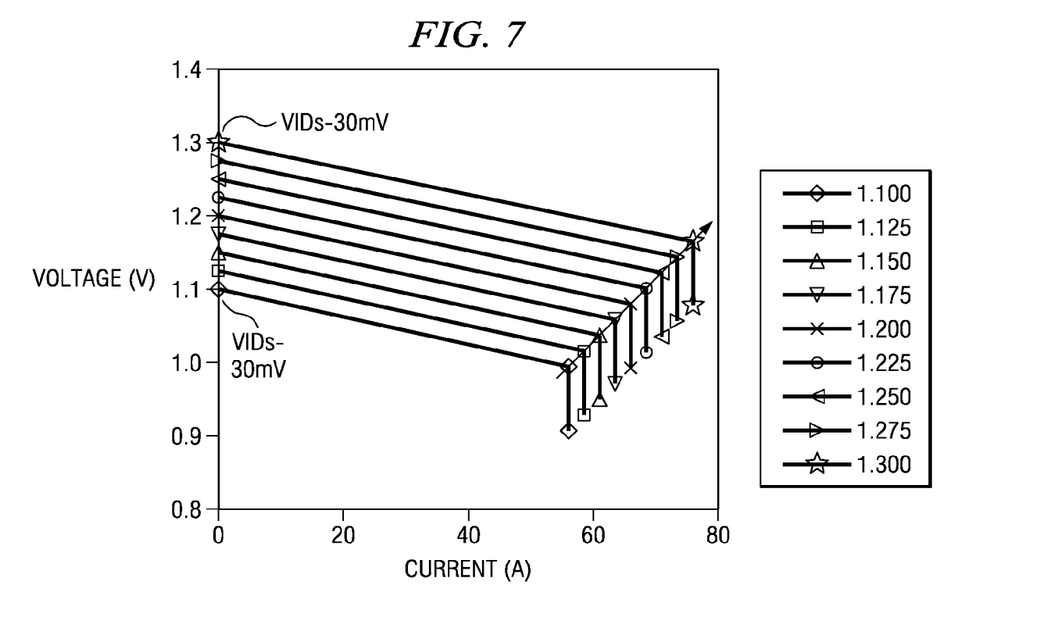
FIG. 7 is a graph illustrating the determination of test voltages for a plurality of VIDs in accordance with an illustrative embodiment.

FIG. 7 is a graph illustrating the determination of test voltages for a plurality of VIDs in accordance with an illustrative embodiment. For each VID in the operational range of the part, the VID sorting system determines the VRM loadline for the voltage regulator module (VRM). Then, the VID sorting system determines where the VRM loadline crosses the I/V curve of the part. From this point, the VID sorting system subtracts a guardband value to determine the $V_{MIN}F$ test voltage for the VID. FIG. 7 illustrates a determination of $V_{MIN}F$ for a range of nine VIDs.

Figure 8:
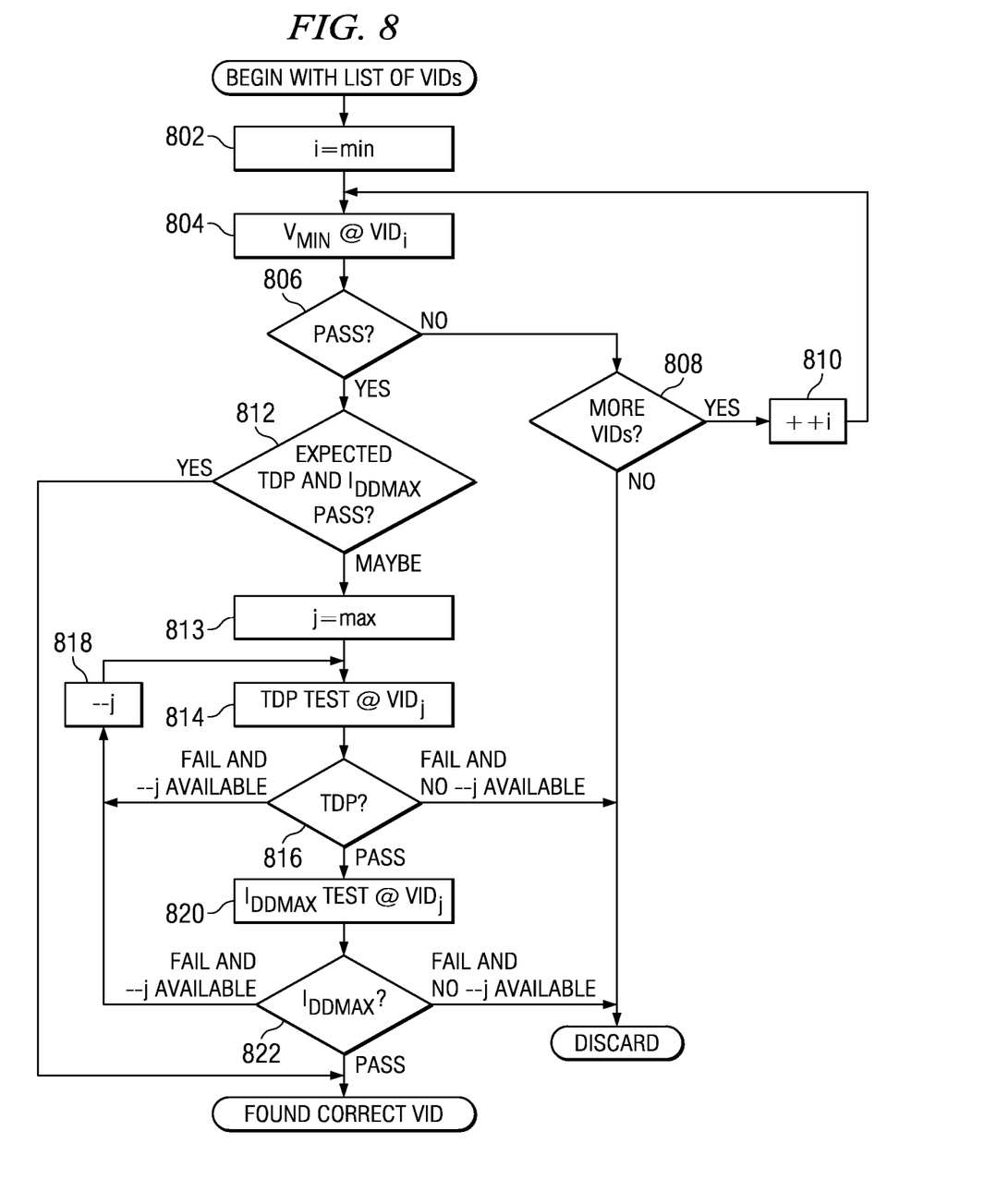
FIG. 8 is a flowchart illustrating the operation of a VID sorting system for finding a VID for a processor in accordance with an illustrative embodiment.

FIG. 8 is a flowchart illustrating the operation of a VID sorting system for finding a VID for a processor in accordance with an illustrative embodiment. Operation begins with a list of VIDs within the operable range calculated in the flowchart of FIG. 5 and shown in the graph of FIG. 6. The VID sorting system sets an index, i, to a minimum value which represents the lowest vid remaining after the execution of block 520 (block 802). The VID sorting system finds a voltage, $V_{MIN}$, for the voltage identifier (VID) corresponding to the index i, $VID_i$ in the list (block 804).

The VID sorting system determines whether the part passes the test at $VID_i$ (block 806). If the part does not pass, then the VID sorting system determines whether there are more VIDs in the list (block 808). If there are no more VIDs in the list, then the part is discarded and operation ends. If there are more VIDs in the list in block 808, the VID sorting system increments the index, i, and operation returns to block 804 to determine the voltage at $VID_i$.

If the part passes the test in block 806 then the VID sorting system determines whether the VID is expected to achieve the thermal design point (TDP) power limit and the $I_{DDMAX}$ limit (block 812). IF the part passes the test in block 812, then the correct VID is found and operation ends. The tests for TDP and IDDMAX are very similar. Each test just measures the amount of power (for TDP) or current (for $I_{DDMAX}$) that the chip consumes.

If the part fails the test in block 812, then the VID sorting system cannot predict whether the part will meet the IDDMAX and the TDP limits, so the VID sorting system sets an index, j, to a maximum index value (block 813) and performs a thermal design point (TDP) test at VIDj (block 814). The VID sorting system determines whether the part passes the TDP test (block 816). If the part fails the TDP test in block 816 and there are no more VID in the list (j cannot be decremented to reference another available VID), then the part is discarded and operation ends. If the part fails the TDP test in block 816 and there are more VID in the list (j can be decremented to reference another available VID), then the VID sorting system decrements j (block 818) and operation returns to block 814 to perform the TDP test using the next VIDj.

If the part passes the TDP test in block 816, the VID sorting system performs an $I_{DDMAX}$ test at $VID_j$ (block 820). The VID sorting system determines whether the part passes the $I_{DDMAX}$ test (block 822). If the part fails the $I_{DDMAX}$ test in block 822 and there are no more VID in the list (j cannot be decremented to reference another available VID), then the part is discarded and operation ends. If the part fails the $I_{DDMAX}$ test in block 822 and there are more VID in the list (j can be decremented to reference another available VID), then the VID sorting system decrements j (block 818) and operation returns to block 814 to perform the TDP test using the next $VID_j$. If the part passes the $I_{DDMAX}$ test in block 822, then the correct VID is found and operation ends.

Figure 9:
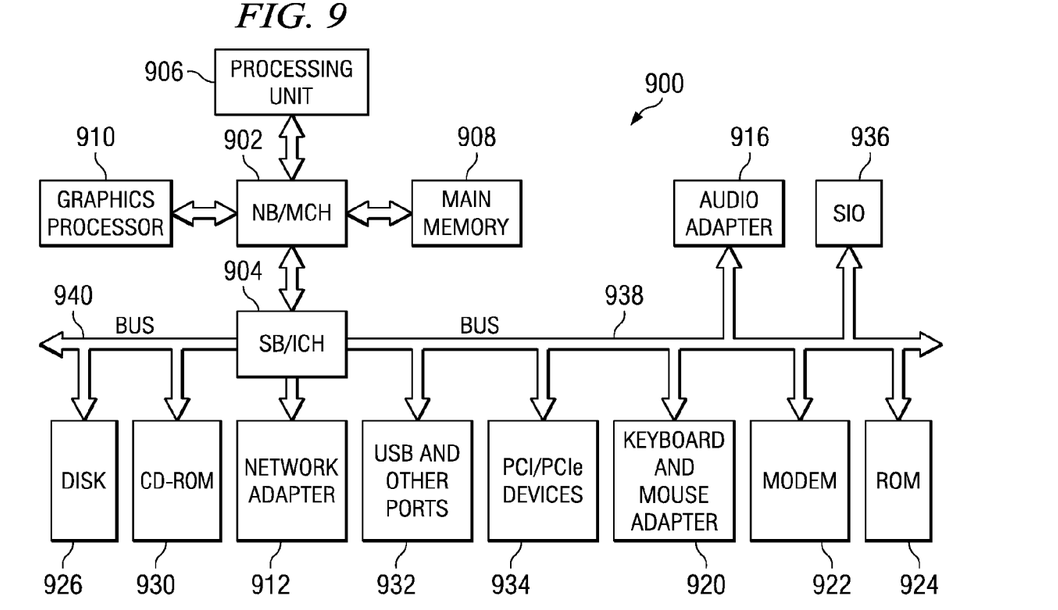
FIG. 9 is a block diagram of an exemplary data processing system in which aspects of the illustrative embodiments may be implemented.It should be appreciated that FIG. 9 is only exemplary and is not intended to assert or imply any limitation with regard to the environments in which aspects or embodiments of the present invention may be implemented. Many modifications to the depicted environments may be made without departing from the spirit and scope of the present invention. Data processing system 900 is an example of a computer, such as VID sorting system 410 in FIG. 4, in which computer usable code or instructions implementing the processes for illustrative embodiments of the present invention may be located.

FIG. 9 is a block diagram of an exemplary data processing system in which aspects of the illustrative embodiments may be implemented. It should be appreciated that FIG. 9 is only exemplary and is not intended to assert or imply any limitation with regard to the environments in which aspects or embodiments of the present invention may be implemented. Many modifications to the depicted environments may be made without departing from the spirit and scope of the present invention. Data processing system 900 is an example of a computer, such as VID sorting system 410 in FIG. 4, in which computer usable code or instructions implementing the processes for illustrative embodiments of the present invention may be located.

In the depicted example, data processing system 900 employs a hub architecture including north bridge and memory controller hub (NB/MCH) 902 and south bridge and input/output (I/O) controller hub (SB/ICH) 904. Processing unit 906, main memory 908, and graphics processor 910 are connected to NB/MCH 902. Graphics processor 910 may be connected to NB/MCH 902 through an accelerated graphics port (AGP).

In the depicted example, local area network (LAN) adapter 912 connects to SB/ICH 904. Audio adapter 916, keyboard and mouse adapter 920, modem 922, read only memory (ROM) 924, hard disk drive (HDD) 926, CD-ROM drive 930, universal serial bus (USB) ports and other communication ports 932, and PCI/PCIe devices 934 connect to SB/ICH 904 through bus 938 and bus 940. PCI/PCIe devices may include, for example, Ethernet adapters, add-in cards, and PC cards for notebook computers. PCI uses a card bus controller, while PCIe does not. ROM 924 may be, for example, a flash binary input/output system (BIOS).

HDD 926 and CD-ROM drive 930 connect to SB/ICH 904 through bus 940. HDD 926 and CD-ROM drive 930 may use, for example, an integrated drive electronics (IDE) or serial advanced technology attachment (SATA) interface. Super I/O (SIO) device 936 may be connected to SB/ICH 904.

An operating system runs on processing unit 906. The operating system coordinates and provides control of various components within the data processing system 900 in FIG. 9. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 900 (Java is a trademark of Sun Microsystems, Inc. in the United States, other countries, or both).

As a server, data processing system 900 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 900 may be a symmetric multiprocessor (SMP) system including a plurality of processors in processing unit 906. Alternatively, a single processor system may be employed.

Instructions for the operating system, the object-oriented programming system, and applications or programs are located on storage devices, such as HDD 926, and may be loaded into main memory 908 for execution by processing unit 906. The processes for illustrative embodiments of the present invention may be performed by processing unit 906 using computer usable program code, which may be located in a memory such as, for example, main memory 908, ROM 924, or in one or more peripheral devices 926 and 930, for example.

A bus system, such as bus 938 or bus 940 as shown in FIG. 9, may be comprised of one or more buses. Of course, the bus system may be implemented using any type of communication fabric or architecture that provides for a transfer of data between different components or devices attached to the fabric or architecture. A communication unit, such as modem 922 or network adapter 912 of FIG. 9, may include one or more devices used to transmit and receive data. A memory may be, for example, main memory 908, ROM 924, or a cache such as found in NB/MCH 902 in FIG. 9.

Those of ordinary skill in the art will appreciate that the hardware in FIG. 9 may vary depending on the implementation. Other internal hardware or peripheral devices, such as flash memory, equivalent non-volatile memory, or optical disk drives and the like, may be used in addition to or in place of the hardware depicted in FIG. 9. Also, the processes of the illustrative embodiments may be applied to a multiprocessor data processing system, other than the SMP system mentioned previously, without departing from the spirit and scope of the present invention.

Thus, the present invention solves the disadvantages of the prior art by providing a voltage identifier (VID) sorting system that optimizes processor power and operating voltage guardband at a constant processor frequency. The VID sorting system determines a voltage versus current curve for the processor. The VID sorting system then uses the voltage versus current characteristics to calculate the power for each VID to determine an acceptable range of VIDs within the maximum power criteria. The VID sorting system then tests VIDs in the range and selects a VID from the range to optimize for minimum power and/or maximum voltage guardband at a constant processor frequency.

It should be appreciated that the illustrative embodiments may take the form of an entirely different hardware embodiment, an entirely different software embodiment or an embodiment containing both different hardware and different software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for sorting voltage identifiers for a processor, the method comprising:

determining, using a semiconductor testing system, an acceptable range of voltage identifiers;

identifying, using the semiconductor testing system, a lowest voltage identifier from the acceptable range of voltage identifiers that passes a functionality test;

identifying, using the semiconductor testing system, a highest voltage identifier from the acceptable range of voltage identifiers that passes a maximum thermal design point power test and a maximum current test; and if both the lowest voltage identifier and the highest voltage identifier are found, selecting a voltage identifier between the lowest voltage identifier and the highest voltage identifier.

2. The method of claim 1, wherein determining an acceptable range of voltage identifiers comprises:

determining an initial voltage based on a ring oscillator speed; and measuring a first current at the initial voltage, where the initial voltage and the first current form a first point;

calculating a maximum power voltage at the maximum acceptable power based on the first current;

measuring a second current at the maximum power voltage plus a guardband value, wherein the maximum power voltage and the second current form a second point; and determining a current versus voltage equation based on the first point and the second point.

3. The method of claim 1, wherein identifying a lowest voltage identifier that passes a functionality test comprises:

selecting a minimum voltage identifier as a test voltage identifier;

determining whether the test voltage identifier passes the functionality test; and if the test voltage identifier passes the functionality test, selecting the test voltage identifier as the lowest voltage identifier.

4. The method of claim 3, wherein determining whether the test voltage identifier passes the functionality test comprises:

determining a current versus voltage curve for the processor;

determining a voltage regulator module loadline for the test voltage identifier;

determining a test voltage at which the voltage regulator module loadline crosses the current versus voltage curve for the processor;

subtracting a guardband value from the test voltage to provide a minimum functional test voltage; and testing functionality of the processor at the minimum functional test voltage.

5. The method of claim 3, wherein identifying a lowest voltage identifier that passes a functionality test further comprises:

if the test voltage identifier does not pass the functionality test, selecting a next higher voltage identifier as the test voltage identifier; and determining whether the test voltage identifier passes the functionality test.

6. The method of claim 1, wherein identifying a highest voltage identifier from the acceptable range of voltage identifiers that passes a maximum thermal design point power test and a maximum current test comprises:

selecting a maximum voltage identifier as a test voltage identifier;

determining whether the test voltage identifier passes the maximum thermal design point power test; and if the test voltage identifier does not pass the maximum thermal design point power test, selecting a next lower voltage identifier as the test voltage identifier; and repeating the determining whether the test voltage identifier passes the maximum thermal design point power test until a test voltage identifier passes the maximum thermal design point power test.

7. The method of claim 6, wherein identifying a highest voltage identifier from the acceptable range of voltage identifiers that passes a maximum thermal design point power test and a maximum current test further comprises:

responsive to a test voltage identifier passing the maximum thermal design point power test, determining whether the test voltage identifier passes the maximum current test; and if the test voltage identifier passes the maximum current test, selecting the test voltage identifier as the highest voltage identifier.

8. The method of claim 7, wherein identifying a highest voltage identifier from the acceptable range of voltage identifiers that passes a maximum thermal design point power test and a maximum current test comprises:

if the test voltage identifier does not pass the maximum current test, selecting a next lower voltage identifier as the test voltage identifier; and repeating the maximum current test until a test voltage identifier passes the maximum current test.

9. The method of claim 1, further comprising:

fusing the selected voltage identifier in voltage identifier logic in the processor.

10. A data processing system for sorting voltage identifiers for a processor, the data processing system comprising:

a processor; and a memory coupled to the processor, wherein the memory contains instructions which, when executed by the processor, cause the processor to:

determine an acceptable range of voltage identifiers;

identify a lowest voltage identifier from the acceptable range of voltage identifiers that passes a functionality test;

identify a highest voltage identifier from the acceptable range of voltage identifiers that passes a maximum thermal design point power test and a maximum current test; and if both the lowest voltage identifier and the highest voltage identifier are found, select a voltage identifier between the lowest voltage identifier and the highest voltage identifier.

11. The data processing system of claim 10, wherein determining an acceptable range of voltage identifiers comprises:

determining an initial voltage based on a ring oscillator speed; and measuring a first current at the initial voltage, where the initial voltage and the first current form a first point;

calculating a maximum power voltage at the maximum acceptable power based on the first current;

measuring a second current at the maximum power voltage plus a guardband value, wherein the maximum power voltage and the second current form a second point; and determining a current versus voltage equation based on the first point and the second point.

12. The data processing system of claim 10, wherein identifying a lowest voltage identifier that passes a functionality test comprises:

selecting a minimum voltage identifier as a test voltage identifier;

determining whether the test voltage identifier passes the functionality test; and if the test voltage identifier passes the functionality test, selecting the test voltage identifier as the lowest voltage identifier.

13. The data processing system of claim 10, wherein identifying a highest voltage identifier from the acceptable range of voltage identifiers that passes a maximum thermal design point power test and a maximum current test comprises:
selecting a maximum voltage identifier as a test voltage identifier;
determining whether the test voltage identifier passes the maximum thermal design point power test; and
if the test voltage identifier does not pass the maximum thermal design point power test, selecting a next lower voltage identifier as the test voltage identifier; and
repeating the determining whether the test voltage identifier passes the maximum thermal design point power test until a test voltage identifier passes the maximum thermal design point power test.

14. A computer program product comprising a computer useable medium having a computer readable program, wherein the computer readable program, when executed on a computing device, causes the computing device to:
determine an acceptable range of voltage identifiers;
identify a lowest voltage identifier from the acceptable range of voltage identifiers that passes a functionality test;
identify a highest voltage identifier from the acceptable range of voltage identifiers that passes a maximum thermal design point power test and a maximum current test; and
if both the lowest voltage identifier and the highest voltage identifier are found, select a voltage identifier between the lowest voltage identifier and the highest voltage identifier.

15. The computer program product of claim 14, wherein determining an acceptable range of voltage identifiers comprises:
determining an initial voltage based on a ring oscillator speed; and
measuring a first current at the initial voltage, where the initial voltage and the first current form a first point;
calculating a maximum power voltage at the maximum acceptable power based on the first current;
measuring a second current at the maximum power voltage plus a guardband value, wherein the maximum power voltage and the second current form a second point; and
determining a current versus voltage equation based on the first point and the second point.

16. The computer program product of claim 14, wherein identifying a lowest voltage identifier that passes a functionality test comprises:
selecting a minimum voltage identifier as a test voltage identifier;
determining whether the test voltage identifier passes the functionality test; and
if the test voltage identifier passes the functionality test, selecting the test voltage identifier as the lowest voltage identifier.

17. The computer program product of claim 16, wherein identifying a lowest voltage identifier that passes a functionality test further comprises:
if the test voltage identifier does not pass the functionality test, selecting a next higher voltage identifier as the test voltage identifier; and
determining whether the test voltage identifier passes the functionality test.

18. The computer program product of claim 14, wherein identifying a highest voltage identifier from the acceptable range of voltage identifiers that passes a maximum thermal design point power test and a maximum current test comprises:
selecting a maximum voltage identifier as a test voltage identifier;
determining whether the test voltage identifier passes the maximum thermal design point power test; and
if the test voltage identifier does not pass the maximum thermal design point power test, selecting a next lower voltage identifier as the test voltage identifier; and
repeating the determining whether the test voltage identifier passes the maximum thermal design point power test until a test voltage identifier passes the maximum thermal design point power test.

19. The computer program product of claim 18, wherein identifying a highest voltage identifier from the acceptable range of voltage identifiers that passes a maximum thermal design point power test and a maximum current test further comprises:
responsive to a test voltage identifier passing the maximum thermal design point power test, determining whether the test voltage identifier passes the maximum current test; and
if the test voltage identifier passes the maximum current test, selecting the test voltage identifier as the highest voltage identifier.

20. The computer program product of claim 19, wherein identifying a highest voltage identifier from the acceptable range of voltage identifiers that passes a maximum thermal design point power test and a maximum current test comprises:
if the test voltage identifier does not pass the maximum current test, selecting a next lower voltage identifier as the test voltage identifier; and
repeating the maximum current test until a test voltage identifier passes the maximum current test.

* * * * *